US012092656B2

(12) United States Patent
Ryu et al.

(10) Patent No.: US 12,092,656 B2
(45) Date of Patent: Sep. 17, 2024

(54) TEST APPARATUS AND TEST METHOD THEREOF

(71) Applicant: SAMSUNG ELECTRONICS CO., LTD., Suwon-si (KR)

(72) Inventors: Sungyoon Ryu, Seoul (KR); Seungbum Hong, Daejeon (KR); Kwangeun Kim, Suwon-si (KR); Hoon Kim, Daejeon (KR); Jiwon Yeom, Nonsan-si (KR); Seokjung Yun, Iksan-si (KR); Souk Kim, Seoul (KR); Younghoon Sohn, Seoul (KR); Yusin Yang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 279 days.

(21) Appl. No.: 17/721,522

(22) Filed: Apr. 15, 2022

(65) Prior Publication Data

US 2022/0404395 A1 Dec. 22, 2022

(30) Foreign Application Priority Data

Jun. 16, 2021 (KR) ........................ 10-2021-0078050

(51) Int. Cl.
*G01R 1/067* (2006.01)
*G01N 29/06* (2006.01)
*G01R 1/04* (2006.01)
*G01R 1/073* (2006.01)

(52) U.S. Cl.
CPC ........... *G01R 1/06727* (2013.01); *G01R 1/04* (2013.01)

(58) Field of Classification Search
CPC . G01R 1/02; G01R 1/04; G01R 1/067; G01R 1/073; G01N 29/06; G01Q 60/32; G01Q 60/38
See application file for complete search history.

(56) References Cited

U.S. PATENT DOCUMENTS

| 4,724,318 A | 2/1988 | Binnig |
| 5,866,807 A * | 2/1999 | Elings ...................... G01N 3/46 |
| | | 977/852 |
| 6,545,273 B1 | 4/2003 | Singh et al. |
| 6,684,686 B2 * | 2/2004 | Itsuji .................... G01Q 10/065 |
| | | 977/863 |

(Continued)

FOREIGN PATENT DOCUMENTS

JP 2002139414 * 10/2000 ............. G01N 13/10

*Primary Examiner* — Neel D Shah
(74) *Attorney, Agent, or Firm* — Muir Patent Law, PLLC

(57) ABSTRACT

A test apparatus includes a movable stage to support a sample, tips above the stage that have different shapes and alternately perform profiling and milling on the sample, a tip stage connected to a cantilever coupled to the tips, the tip stage to adjust a position of the cantilever, a position sensor to obtain information about a positional relationship between the tips and the sample, a stage controller to control movements of the stage and the tip stage, based on the information about the positional relationship, and a tip controller to select the tips for performing the profiling or milling and to determine conditions for performing milling, wherein a depth of the sample being processed by the milling in the first direction is controlled based on a relationship between a distance between the tips and the sample and a force between the tips and the sample.

20 Claims, 11 Drawing Sheets

(56) References Cited

U.S. PATENT DOCUMENTS

| | | |
|---|---|---|
| 8,153,338 B2 | 4/2012 | Park et al. |
| 9,581,617 B2 | 2/2017 | Lee et al. |
| 9,869,696 B2 | 1/2018 | Erickson et al. |
| 10,139,429 B2 | 11/2018 | Zumwalt et al. |
| 2006/0040057 A1 | 2/2006 | Sheehan et al. |
| 2007/0003336 A1* | 1/2007 | Ninomiya .......... G03G 21/0035 399/349 |
| 2010/0031402 A1* | 2/2010 | Wakiyama ............ G01Q 30/06 850/1 |

* cited by examiner

TEST APPARATUS AND TEST METHOD THEREOF

CROSS TO REFERENCE TO RELATED APPLICATION

This application claims benefit of priority to Korean Patent Application No. 10-2021-0078050, filed on Jun. 16, 2021, in the Korean Intellectual Property Office, the disclosure of which is incorporated herein by reference in its entirety.

BACKGROUND

1. Field

Example embodiments of the present disclosure relate to a test apparatus and a test method thereof.

2. Description of the Related Art

When performing a semiconductor process, it may be necessary to monitor the structure of a device to determine whether the structure of the device formed in each operation satisfies a desired goal. Generally, the monitoring may be performed using a measuring device installed in the facility or using destructive analysis equipment, e.g., transmission electron microscopy (TEM) and scanning electron microscopy (SEM). An atomic force microscope (AFM), a scanning device, may be used to observe minute irregularities on the surface of a sample by detecting a curvature of a cantilever caused by force between a tip and the sample.

SUMMARY

According to an example embodiment of the present disclosure, a test apparatus includes a sample stage on which a sample is disposed on an upper surface thereof, and configured to adjust a position of the sample in a direction parallel to the upper surface; a plurality of tips having different shapes, configured to alternately perform profiling and milling on the sample, and disposed on the sample while performing the profiling or milling; a tip stage connected to a cantilever coupled to one of the plurality of tips and configured to adjust a position of the cantilever in a first direction perpendicular to the upper surface of the sample stage; a position sensor configured to obtain information about a positional relationship between the tip coupled to the cantilever and the sample; a stage control unit configured to control movements of the sample stage and the tip stage based on the information about the positional relationship; and a tip control unit configured to select a tip for performing the profiling or milling from among the plurality of tips and to determine conditions for performing milling, wherein a depth of the sample being processed by the milling in the first direction is controlled based on a relationship between a distance between the tip and the sample and force between the tip and the sample.

According to an example embodiment of the present disclosure, a test apparatus includes a sample stage on which a sample is disposed on an upper surface thereof, and configured to adjust a position of the sample in a direction parallel to the upper surface; a plurality of tips including a first tip configured to perform pre-profiling to obtain surface information of the sample, a second tip configured to perform milling on the sample, and a third tip configured to perform profiling on the sample, where the first tip, the second tip, and the third tip have different shapes; a tip stage connected to a cantilever coupled to each of the plurality of tips and configured to adjust a position of the cantilever in a first direction perpendicular to an upper surface of the sample stage; a position sensor configured to obtain information about a positional relationship between a tip for performing the profiling or milling among the plurality of tips and the sample; a stage control unit configured to control movements of the sample stage and the tip stage based on the information about the positional relationship; and a tip control unit configured to select a tip for performing the profiling or milling and to determine conditions for performing milling.

According to an example embodiment of the present disclosure, a test apparatus includes a sample stage on which a sample is disposed on an upper surface thereof, and configured to adjust a position of the sample in a direction parallel to the upper surface; a plurality of test units disposed on the sample, and each including a tip configured to perform profiling or milling on the sample until reaching a predetermined depth, a tip stage connected to a cantilever coupled to the tip and configured to adjust a position of each of the cantilevers in a first direction perpendicular to the upper surface of the sample stage, a position sensor configured to obtain information about a positional relationship between the tip and the sample, and a stage control unit configured to control a movement of the tip stage based on information about the positional relationship; and a tip control unit configured to select a test unit to perform profiling or milling from among the plurality of test units, and to determine conditions for milling based on a relationship between a distance between the tip and the sample and force between the tip and the sample, wherein the tips included in each of the plurality of test units are configured to have different shapes.

According to an example embodiment of the present disclosure, a test method includes disposing a sample on an upper surface of a sample stage; performing pre-profiling on a surface of the sample using a first tip coupled to a cantilever; milling the sample using the second tip after coupling a second tip having a shape different from a shape of the first tip to the cantilever; performing profiling on the sample using the third tip after coupling a third tip having a shape different from shapes of the first tip and the second tip to the cantilever; repeatedly performing the milling and the profiling until performing profiling on the sample at a predetermined depth; and obtaining a structural information from the surface of the sample to a predetermined depth, wherein in the performing the milling, a milling depth for the sample is controlled based on a distance between the second tip and the sample and force between the second tip and the sample.

According to an example embodiment of the present disclosure, a test method includes disposing a sample on an upper surface of a sample stage; performing pre-profiling on a surface of the sample using a first tip coupled to a cantilever; selecting a second tip having a shape different from a shape of the first tip based on a result of pre-profiling, and determining optimal conditions for performing milling; performing milling on the sample using the second tip; selecting a third tip having a shape different from shapes of the first tip and the second tip based on a result of the milling; performing profiling on the sample using the third tip; repeatedly performing the milling and the profiling until performing profiling on the sample at a predetermined depth; and obtaining a structural information from the surface of the sample to a predetermined depth.

According to an example embodiment of the present disclosure, a test method includes disposing a sample on an upper surface of a sample stage; performing pre-profiling on a surface of the sample using a first tip coupled to a cantilever of a plurality of test units; selecting a first test unit based on a result of the pre-profiling; selecting a second tip having a shape different from a shape of the first tip and determining optimal conditions for performing milling; performing milling on the sample using the second tip coupled to a cantilever of the first test unit; selecting a second test unit based on a result of the milling; selecting a third tip having a shape different from shapes of the first tip and the second tip; performing profiling on the sample using the third tip coupled to a cantilever of the second test unit; repeatedly performing the milling and the profiling until performing profiling on the sample at a predetermined depth; and obtaining a structural information from the surface of the sample to a predetermined depth.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
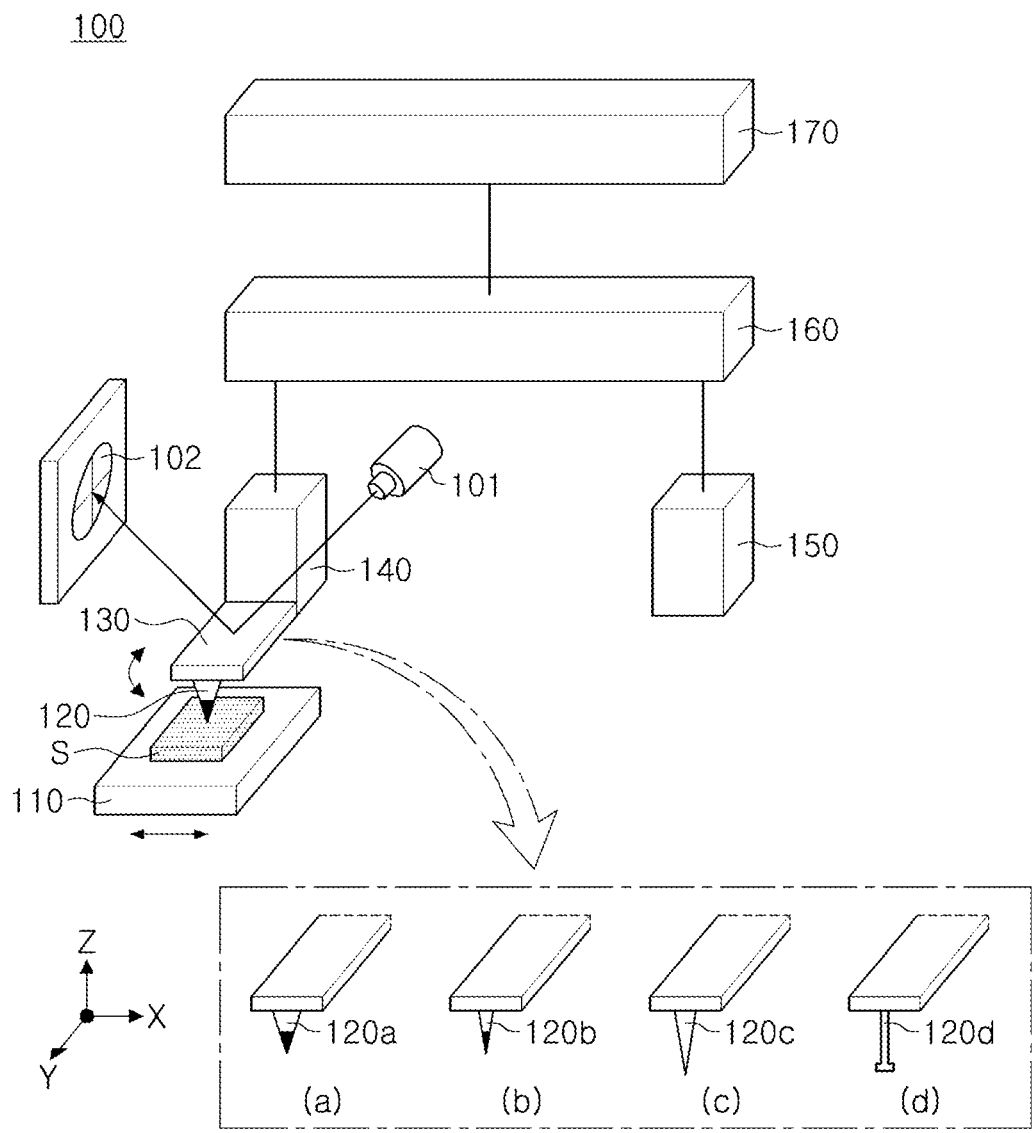
FIG. 1 is a diagram illustrating a test apparatus according to an example embodiment of the present disclosure.

FIG. 1 is a diagram illustrating a test apparatus according to an example embodiment.

Referring to FIG. 1, a test apparatus 100 in an example embodiment may include a sample stage 110, a plurality of tips 120, a cantilever 130, a tip stage 140, a position sensor 150, a stage control unit 160 (i.e., a stage controller), and a tip control unit 170 (i.e., a tip controller).

A sample S may be disposed on an upper surface of the sample stage 110. The sample stage 110 may be movable to adjust the position of the sample S by moving in a direction (e.g., the X direction or the Y direction) parallel to the upper surface. For example, the sample S may be implemented as a semiconductor device, e.g., a dynamic random-access memory (DRAM) or a VNAND, formed through a semiconductor process. The semiconductor device may include a structure having a high aspect ratio, e.g., a channel hole and a word line cut. However, in example embodiments, the sample S may not be limited to a semiconductor device. Also, the test apparatus 100 in an example embodiment may perform a structural inspection more effectively than a general test apparatus during inspection of a semiconductor device including a structure having a high aspect ratio. The test apparatus 100 may perform structural inspection on semiconductor devices having various structures.

The plurality of tips 120, e.g., probe tips, may be disposed on, e.g., above, the sample S and may perform a testing operation on the sample S. For example, as illustrated in FIG. 1, at least one the plurality of tips 120 may extend from the cantilever 130 toward the sample stage 110. The testing operation may include profiling and milling of the sample S, and the test apparatus 100 in an example embodiment may alternately perform profiling and milling. However, an example embodiment thereof is not limited thereto, and the test apparatus 100 may further perform other operations, e.g., cleaning in addition to profiling and milling.

The plurality of tips 120 may have different shapes, may have different levels of rigidity, and may be replaced depending on a test stage. The plurality of tips 120 may include a single crystal diamond layer.

For example, the tips 120a and 120b illustrated in respective parts (a) and (b) of FIG. 1 may have a conical shape and a pointed end, e.g., the pointed end may point away from the cantilever 130. The tip 120a illustrated in part (a) of FIG. 1 may have a width smaller than that of the tip 120b illustrated in part (b) of FIG. 1B. Accordingly, the tip 120a illustrated in part (a) of FIG. 1 may have a different aspect ratio than the tip 120b illustrated in part (b) of FIG. 1. The tip 120d illustrated in part (d) of FIG. 1 may have a blunt hammer-shaped head, different from the tip 120c illustrated in part (c) of FIG. 1.

The plurality of tips 120 may be designed to have various lengths, radii, aspect ratios, and shapes if desired. The test apparatus 100 may select at least one of the plurality of tips 120 designed in various shapes and may perform profiling, milling, or the like, during the testing operation.

Profiling may be an operation for obtaining information of the upper surface of the sample S. In the test apparatus 100 in an example embodiment, the structure of the sample S in the first direction and the structure of the sample S in the direction perpendicular to the first direction may be inspected by profiling. As an example, profiling may include pre-profiling performed initially and profiling performed after milling. The test apparatus 100 may obtain structural information and information of physical properties of the surface of the sample S from pre-profiling. The test apparatus 100 may measure the structural information of the sample S relatively precisely by profiling performed after milling as compared with pre-profiling.

Milling may be an operation of processing at least a portion of the sample S to a predetermined depth by forming a cut-out surface in a predetermined position on the upper surface of the sample S. The test apparatus 100 in an example embodiment may perform milling on the sample S according to predetermined milling conditions. For example, the conditions for performing milling may include at least one of a milling direction, a milling area, and a milling depth. However, an example embodiment thereof is not limited thereto, and the test apparatus 100 may perform milling controlled by various parameters.

The cantilever 130 may be coupled to at least one of the plurality of tips 120. The tip stage 140 may be connected to the cantilever 130 and may adjust the position of the cantilever 130 in a first direction (e.g., Z direction) perpendicular to the upper surface of the sample stage 110. For example, a distance between one of the plurality of tips 120 and the sample S may be determined based on the position of the cantilever 130, and a van der Waals force between the at least one of the plurality of tips 120 and the sample S may be determined based on the distance.

The Van der Waals force between one of the plurality of tips 120 and the sample S may determine a mode in which profiling is performed. As an example, profiling, e.g., to determine a three-dimensional (3D) shape of the sample S based on the cantilever 130 movement, may be performed in a non-contact mode, i.e., in which an attractive force acts between one of the plurality of tips 120 and the sample S, a contact mode, i.e., in which a repulsive force acts between one of the plurality of tips 120 and the sample S, and a tapping mode, i.e., in which the plurality of tips 120 vibrate. Milling may be an operation of processing the sample S, e.g., reducing a height of a protrusion, and may be performed by further increasing the force between one of the plurality of tips 120 and the sample S.

The test apparatus 100 in an example embodiment may detect a curvature of the cantilever 130 when profiling the sample S and may obtain the structural information of the surface of the sample S. For example, the test apparatus 100 may reflect light incident from a laser device 101 to the cantilever 130 and may allow light to be incident to a photodiode 102, e.g., light from the laser device 101 may be incident on the cantilever 130 to be reflected toward the photodiode 102. The photodiode 102 may detect the curvature of the cantilever 130 based on the information about the incident light, e.g., based on the amount of light reflected from the cantilever in accordance with the surface curvature. The test apparatus 100 may obtain structural information of the surface of the sample S from the detected curvature of the cantilever 130.

When the test apparatus 100 performs milling on the sample S, a milling depth may be determined by force between the plurality of tips 120 and the sample S. For example, as the force between the plurality of tips 120 and the sample S increases, the milling depth may increase, e.g., the depth may vary based on the force applied to the tip during the pre-profiling using a specially manufactured diamond tip. The test apparatus 100 in an example embodiment may accurately determine the milling depth based on a relationship between the force between the plurality of tips 120 and the sample S and the distance between the plurality of tips 120 and the sample S. In addition, The test apparatus 100 in an example embodiment may accurately determine the milling depth based on the curvature of the cantilever 130.

The position sensor 150 may obtain information about the positional relationship between the sample S and one of the plurality of tips 120 coupled to the cantilever 130. The position sensor 150 may transmit information about the obtained positional relationship to the stage control unit 160 and/or the tip control unit 170.

The stage control unit 160 may control the movements of the sample stage 110 and the tip stage 140 based on the information about the positional relationship. For example, the test apparatus 100 may control the sample stage 110 to adjust a position of a sample on which profiling and milling are performed. Also, the test apparatus 100 may control the tip stage 140 to adjust the position of the tip in consideration of the type of the tip for performing profiling and milling and/or the conditions for performing the milling.

In other words, in the test apparatus 100 in an example embodiment, the stage control unit 160 configured to control the movements of the sample stage 110 and the tip stage 140 may be driven in consideration of the distance between the plurality of tips 120 and the sample S and the force between the plurality of tips 120 and the sample S. Also, the test apparatus 100 may drive the tip control unit 170 configured to determine the conditions for performing milling based on a relationship between the distance between the plurality of tips 120 and the sample S and the force between the plurality of tips 120 and the sample S.

The tip control unit 170 may select a tip 120 to perform the testing operation from among the plurality of tips 120. The tip control unit 170 may select a tip 120 optimized for a subsequent testing operation. In an example, the tip control unit 170 may select one of the plurality of tips 120 based on at least one of a shape of the tip, the rigidity of the tip, the structural information of the surface of the sample S, and information of physical properties of the surface of the sample S.

When the test apparatus 100 performs profiling, the tip control unit 170 may select a tip 120 optimized for profiling the sample S. When the test apparatus 100 performs milling, the tip control unit 170 may select a tip 120 optimized for milling the sample S, and may determine optimal conditions for performing milling.

In the test apparatus 100 in an example embodiment, the operation of selecting an optimized tip 120 for the testing operation may be performed by comprehensively considering a size of the tip, a length of the tip (e.g., in the Z direction), an aspect ratio of the tip, a radius of the tip (in the X or Y direction), and a structure of the tip. For example, the structure of the tip may include a thickness of a diamond layer (e.g., in the Z direction) included in the tip, a thickness (e.g., in the Z direction) of the cantilever 130, a length (e.g., in the Y direction) of the cantilever 130, and the like.

Hardness of the tip 120 used for milling may be greater than hardness of the element of the sample S on which milling is performed. When the test apparatus 100 performs milling, the selected tip may vary depending on whether milling is performed over a large area at a high speed or milling is precisely performed over a relatively narrow area.

For example, when milling is performed on a large area at a high speed, the test apparatus 100 may select as an optimal tip a tip having a small aspect ratio and a large radius from among the plurality of tips 120, e.g., tip 120a illustrated in part (a) of FIG. 1. In another example, when milling is precisely performed on a small area, the test apparatus 100 may select as an optimal tip a tip having a large aspect ratio and a small radius from among the plurality of tips 120, e.g., tip 120b illustrated in part (b) of FIG. 1.

The hardness of the tip used for profiling may be relatively smaller than the hardness of the tip used for milling. When the test apparatus 100 performs profiling, the selected tip may vary depending on whether the profiling is performed on the surface of the sample S or the profiling is performed on the sidewall of the sample S. Also, the length and radius of the tip selected may vary depending on the degree to which profiling is precisely performed.

For example, when profiling is performed on the surface of the sample S, the test apparatus 100 may select as an optimal tip a cone-shaped tip having a large aspect ratio, e.g., tip 120c illustrated in part (c) of FIG. 1C. In another example, when profiling is performed on the sidewall of the sample S, the test apparatus 100 may select as an optimal tip a tip having a hammer-shaped head from among the plurality of tips 120, e.g., tip 120d illustrated in part (d) of FIG. 1.

The test apparatus 100 in an example embodiment may repeatedly perform profiling and milling until the structural information of the sample S is obtained at a predetermined depth. For example, the test apparatus 100 may selectively perform milling in a predetermined position of the sample S by controlling the movements of the sample stage 110 and the tip stage 140 based on a result of profiling.

Among the plurality of tips 120, a plurality of some tips may perform profiling and a plurality of other tips may perform milling. Each of the plurality of tips 120 may have a different shape and/or different levels of rigidity. The tip control unit 170 may select an optimized tip for each testing operation and may perform the testing operation.

For example, the test apparatus 100 may perform pre-profiling using one of the plurality of tips 120 before milling, may perform milling using another tip of the plurality of tips 120, and may perform profiling (after milling) using yet another tip of the plurality of tips 120.

However, the test apparatus 100 in an example embodiment may not be limited to the example illustrated in FIG. 1. For example, in the test apparatus 100, components not illustrated in FIG. 1 may be added, and a portion of the illustrated components may not be provided or may have a different shape. Although not illustrated in FIG. 1, the test apparatus 100 in an example embodiment may further include a vibration isolation table disposed below the sample stage 110. The vibration isolation table may support the test apparatus 100 to not affect a test result even when vibration occurs during the testing operation.

Also, the connection relationship between the components included in the test apparatus 100, the connection relationship between the position sensor 150, the stage control unit 160, and the tip control unit 170 for controlling the testing operation of the test apparatus 100 may not be limited to the illustrated example, and may be replaced with other components performing similar functions.

Figure 2:
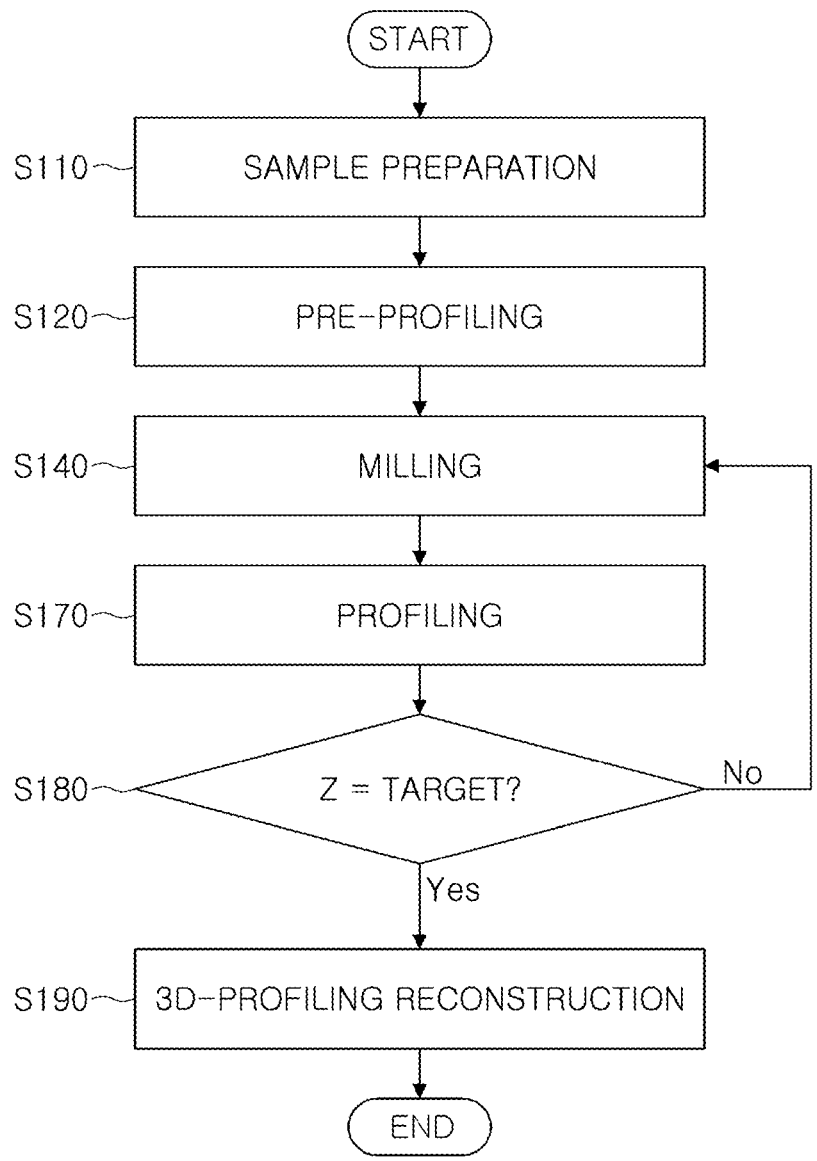
FIG. 2 is a flowchart illustrating a test method by a test apparatus according to an example embodiment of the present disclosure.

FIG. 2 is a flowchart illustrating a test method by the test apparatus 100 according to an example embodiment.

Referring to FIGS. 1 and 2, the test method by the test apparatus 100 in an example embodiment may be started by disposing the sample S on the upper surface of the sample stage 110 (i.e., sample preparation in S110). Next, a first tip for performing pre-profiling may be coupled to the cantilever 130 included in the test apparatus 100, and the test apparatus 100 may perform pre-profiling on the surface of the sample S using the first tip coupled to the cantilever 130 (S120).

The test apparatus 100 in an example embodiment may obtain structural information and information of physical properties of the surface of the sample S from pre-profiling. As an example, the structural information of the surface of the sample S may include information regarding existence of, e.g., serrations, curvatures, inclinations, or the like, on the surface of the sample S. Further, the information of physical properties of the surface of the sample S may include information of mechanical properties, e.g., an elastic modulus and hardness of the sample S depending on the position on the surface of the sample S.

After completing the pre-profiling using the first tip, the test apparatus 100 may couple a second tip having a shape different from that of the first tip to the cantilever 130, and may perform milling on the sample S using the second tip (S140). For example, the first tip may be, e.g., automatically, replaced with the second tip via a motor, e.g., a robotic arm. Milling in operation S140 may be controlled based on various information obtained from pre-profiling.

After the milling is completed using the second tip, the test apparatus 100 may couple a third tip having a shape different from the first tip and the second tip to the cantilever 130, and may perform profiling on the sample S using the third tip (S170). For example, the profiling in operation S170 using the third tip may be precise profiling for the sample S.

The test apparatus 100 in an example embodiment may obtain structural information and/or information of physical properties of the sample S on which milling was performed by the profiling performed in this operation. The information obtained in operation S170 may include relatively precise structural information and/or information of physical properties as compared to the information obtained in operation S120. The first tip, the second tip, and the third tip may be configured to have different shapes and also different levels of rigidity.

After the profiling is completed using the third tip, the test apparatus 100 may determine whether the structural information at the target depth has been obtained (S180). When the test apparatus 100 fails to obtain the structural information at the target depth, the test apparatus 100 may repeatedly perform operations S140 to S180 until the structural information at a predetermined depth corresponding to the target depth is obtained. As an example, milling and profiling in the first cycle may be defined as first milling and first profiling, milling and profiling in the second cycle may be defined as second milling and second profiling, and milling and profiling in the n-th cycle may be defined as n-th milling and n-th profiling.

In this case, the depth of the sample S processed in at least two of the first to n-th milling may be different from each other. The depth of the sample S to be processed may be determined based on the result of the profiling performed in the previous operation.

In the test apparatus 100 in an example embodiment, each of the second tip and the third tip may include a plurality of tips having different shapes and/or different levels of rigidity. Accordingly, each of the first to n-th milling may be performed using the second tips having different shapes and/or different levels of rigidity. Also, each of the first to n-th profiling may be performed using the third tips having a different shape and/or different levels of rigidity.

When the test apparatus 100 obtains the structural information at the target depth, the test apparatus 100 may reconstruct the structural information obtained in the previous operations, and may obtain the structural information from the surface of the sample S to the target depth (S190).

General test apparatuses may inspect a structure, test physical properties of a microstructure, e.g., having a size of micro-unit or nano-unit, or pattern by a nano-unit using a single tip coated with a special compound. However, while a general test apparatus may perform milling using a single tip having a relatively small aspect ratio and a large tip radius at a high speed over a large area, such a tip may be difficult to use when selectively performing milling on a narrow area, e.g., it may be difficult to accurately measure the structure of the microstructure due to the large radius. On the other hand, while the general test apparatus may perform milling using a single tip having a relatively large aspect ratio and a small tip radius to precisely perform milling on a small area, it may be difficult to perform milling over a large area, e.g., the speed thereof may be slow causing increased time required for structure measurement.

In contrast, the test apparatus 100 in an example embodiment may include a plurality of different tips with different shapes and rigidity levels, such that an optimal tip of the plurality of tips may be selected for each desired operation, e.g., to perform milling under optimal milling conditions within a same apparatus. As such, a microstructure may be accurately measured at a high speed, e.g., as compared to a general test apparatus. Further, even when profiling is performed, the same test apparatus 100 in an example embodiment may select an optimal tip depending on the structure and depth for perform profiling, so precise profiling of the surface and sidewall of the microstructure may be performed.

Figure 3:
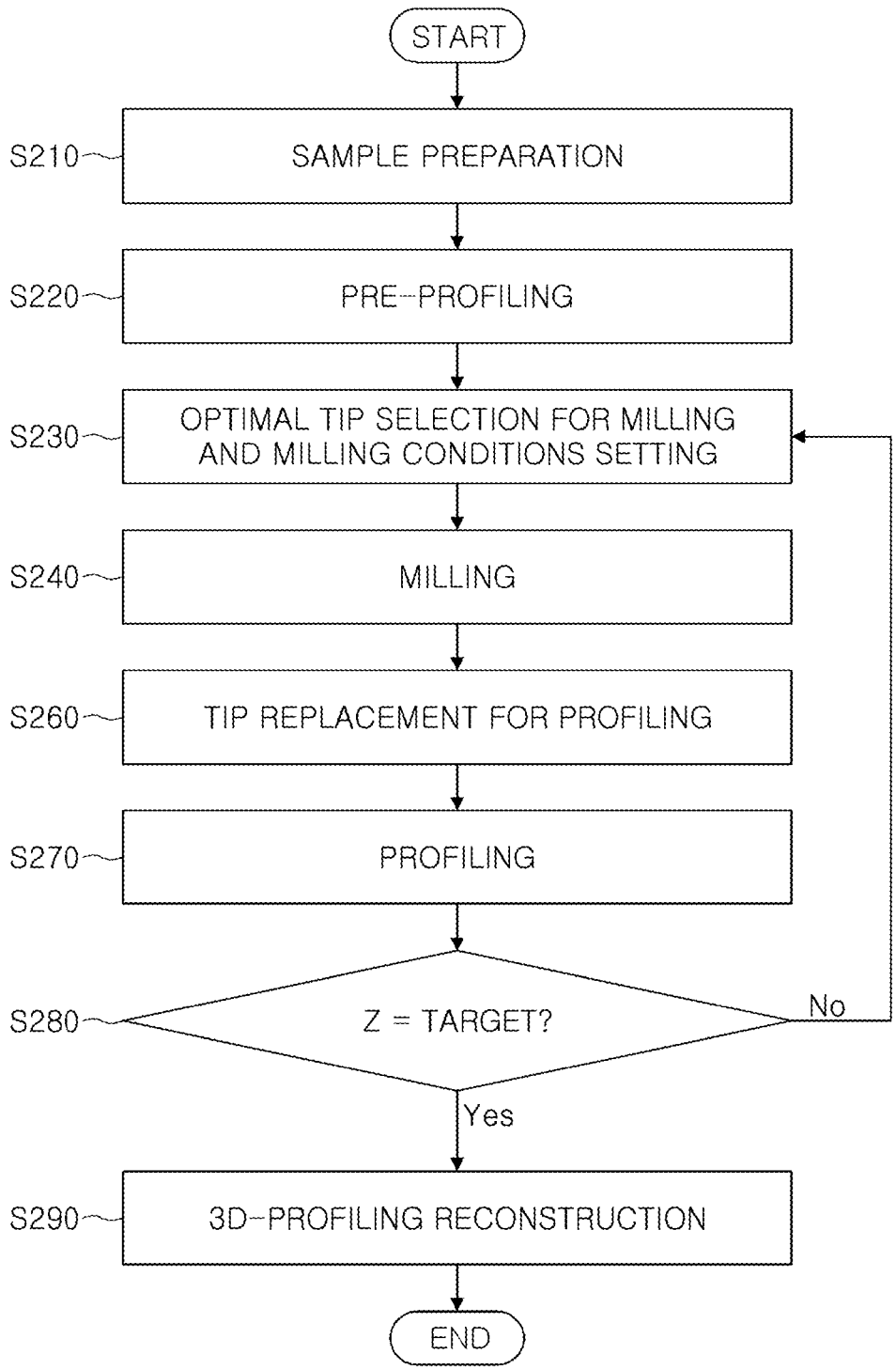
FIG. 3 is a flowchart illustrating a test method by a test apparatus according to an example embodiment of the present disclosure.

FIG. 3 is a flowchart illustrating a test method by the test apparatus 100 according to an example embodiment.

Referring to FIG. 3, the test method by the test apparatus 100 in an example embodiment may include operations corresponding to operations S110 to S190 illustrated in FIG. 2. As an example, the test apparatus 100 may start a testing operation by disposing the sample S on the upper surface of the sample stage 110 (S210), and may perform pre-profiling on the surface of the sample S using the first tip before a structural test (S220). As an example, the first tip may be a tip optimized for obtaining structural information and information of physical properties of the surface of the sample S from pre-profiling.

The stage control unit 160 of the test apparatus 100 may control the movement of the sample stage 110 and the tip stage 140 using the result of the pre-profiling. Also, the tip control unit 170 of the test apparatus 100 may select a second tip optimized for performing milling, and may determine conditions for performing milling based on a result of pre-profiling (S230). The test apparatus 100 may perform milling on the sample S under the determined milling conditions using the selected second tip (S240).

In the operation of milling, the positional relationship between the sample S and the second tip may be controlled by the movements of the sample stage 110 and the tip stage 140. For example, milling may not necessarily be performed on the entire area of the sample S. Milling of the sample S may be selectively performed in a predetermined position and/or area depending on the positional relationship between the sample S and the second tip controlled by the movements of the sample stage 110 and the tip stage 140.

After milling is completed, the tip control unit 170 of the test apparatus 100 in an example embodiment may select a third tip optimized for performing profiling and may replace the tip (S260). Similarly to the test method illustrated in FIG. 2, the test apparatus 100 may perform profiling on the sample S using the replaced third tip (S270).

After the profiling is completed using the third tip, the test apparatus 100 may determine whether structural information at the target depth has been obtained (S280). When the structural information at the target depth is not obtained, the test apparatus 100 may repeat operations S230 to S280 until the structural information at a predetermined depth corresponding to the target depth is obtained.

As described above, in the test apparatus 100 in an example embodiment, the first tip, the second tip, and the third tip may have different shapes and/or different levels of rigidity, and each of the second tip and the third tip may include a plurality of tips having different shapes and/or different levels of rigidity. When the test apparatus 100 obtains the structural information at the target depth, the test apparatus 100 may reconstruct the structural information obtained in the previous operations, and may obtain the structural information from the surface of the sample S to the target depth (S290).

Although not illustrated in FIG. 3, the test apparatus 100 in an example embodiment may further include a fourth tip for performing cleaning to remove by-products after milling. The fourth tip may have a shape and/or rigidity different from those of the first, second, and third tips. For example, the cleaning may be performed after the milling in operation S240 is completed and before the profiling in operation S270 is performed.

FIGS. 4 to 11 are diagrams illustrating an operation of the test apparatus 100 according to an example embodiment.

Figure 4:
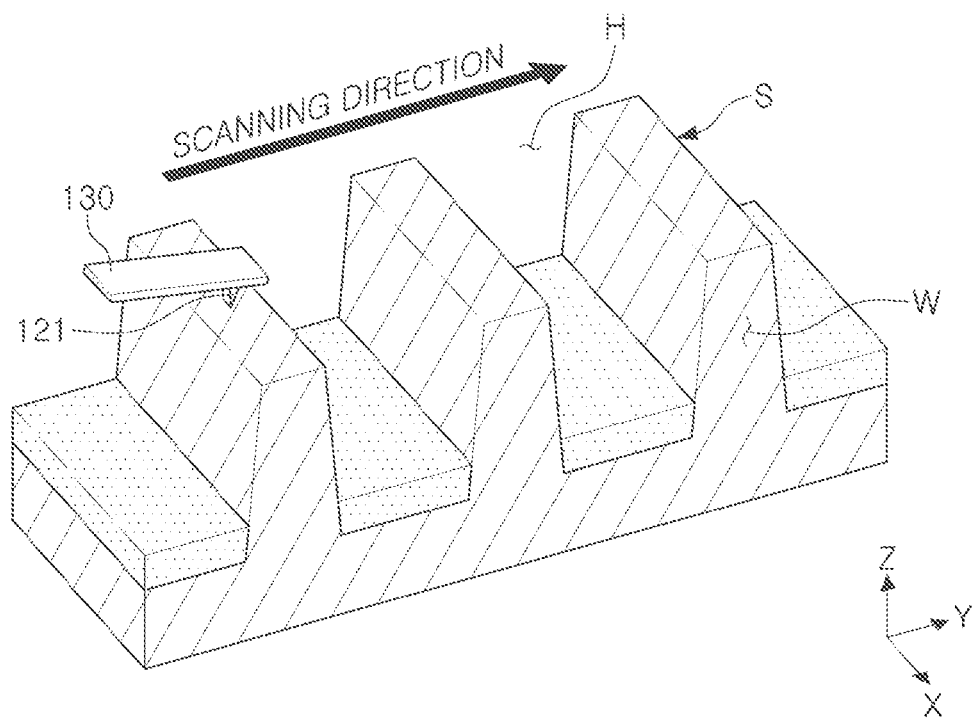
FIGS. 4 to 11 are diagrams illustrating an operation of a test apparatus according to an example embodiment of the present disclosure.

Referring to FIGS. 1 and 4, the sample S, of which a structure is measured using the test apparatus 100 in an example embodiment, may include a serration structure including a hole H and/or a protrusion W on the surface thereof. The sample S may be disposed on the upper surface of the sample stage in the first direction (e.g., the Z direction), and the test apparatus 100 may perform a test in a predetermined scanning direction. In FIG. 4, the scan direction is illustrated as a second direction (e.g., X direction) parallel to the upper surface of the sample stage.

The test apparatus 100 in an example embodiment may perform a first test using the first tip 121 coupled to the cantilever 130. For example, the first test may be profiling, and the profiling performed initially may be a pre-profiling for obtaining surface information and/or information of physical properties of the sample S. While profiling is performed, the stage control unit 160 included in the test apparatus 100 may adjust the position of the cantilever 130 in the first direction based on information obtained from the position sensor 150.

Figure 5:
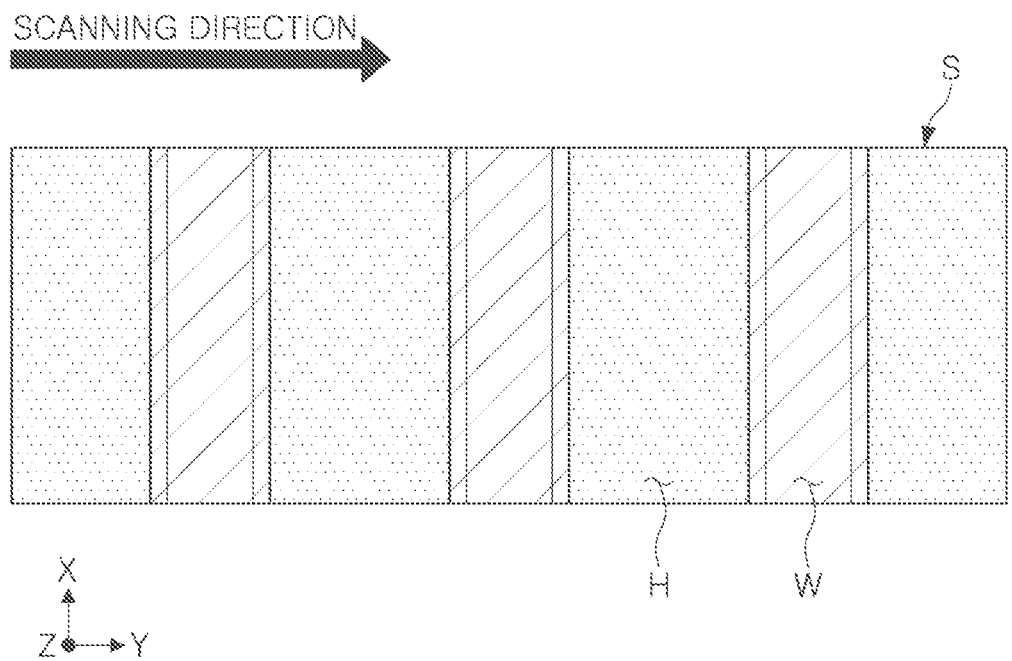
Figure 6:
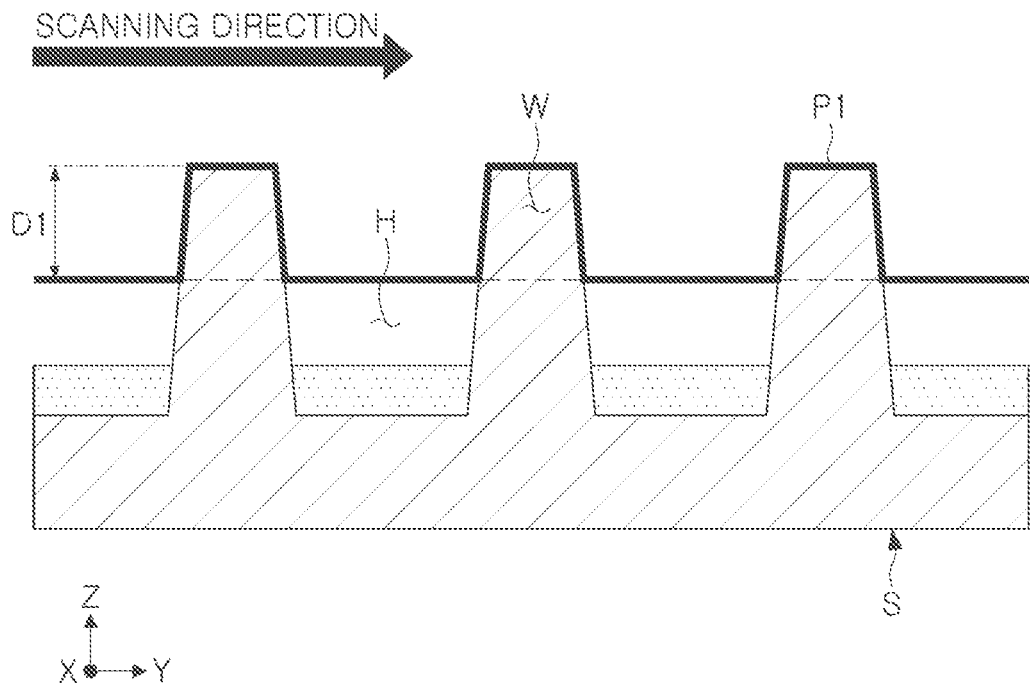

Referring to FIGS. 5 and 6, the test apparatus 100 in an example embodiment may obtain surface information and/or information of physical properties of the sample S from pre-profiling. For example, the test apparatus 100 may obtain a first test result by performing pre-profiling. For example, the first test result may include a first profiling result P1 corresponding to a structure corresponding to a first depth D1 from the surface of the sample S. For example, referring to FIGS. 4-6, as a result of the cantilever 130 moving along the scanning direction with the first tip 121 extended toward the sample S (FIG. 4), a preliminary shape of the holes H and protrusions W in the sample S (e.g., distance and depth as illustrated in FIGS. 5 and 6) may be determined, e.g., pre-profiled.

Figure 7:
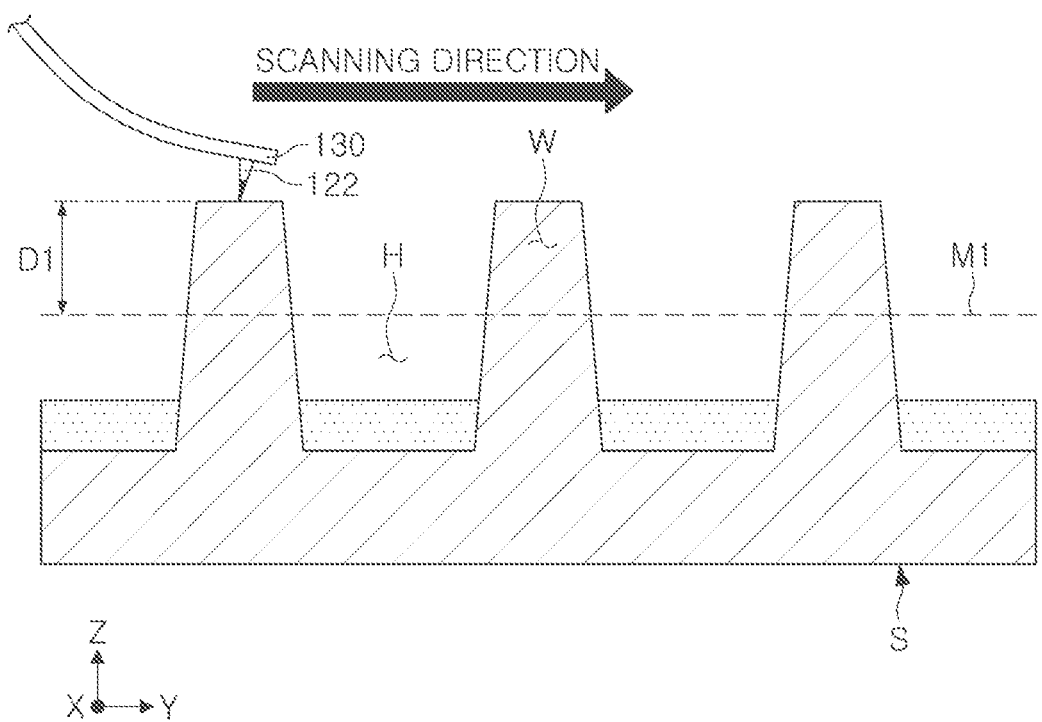

Referring to FIG. 7, the tip control unit 170 included in the test apparatus 100 may select the second tip 122 for performing milling on the sample S based on the first test result, and may determine conditions for performing the milling. For example, the test apparatus 100 may perform milling by the first depth D1 (determined in the pre-profiling) by adjusting the force between the second tip 122 and the sample S. The test apparatus 100 may remove the protrusion W formed in a position higher than the first milling position M1 by performing milling.

Figure 8:
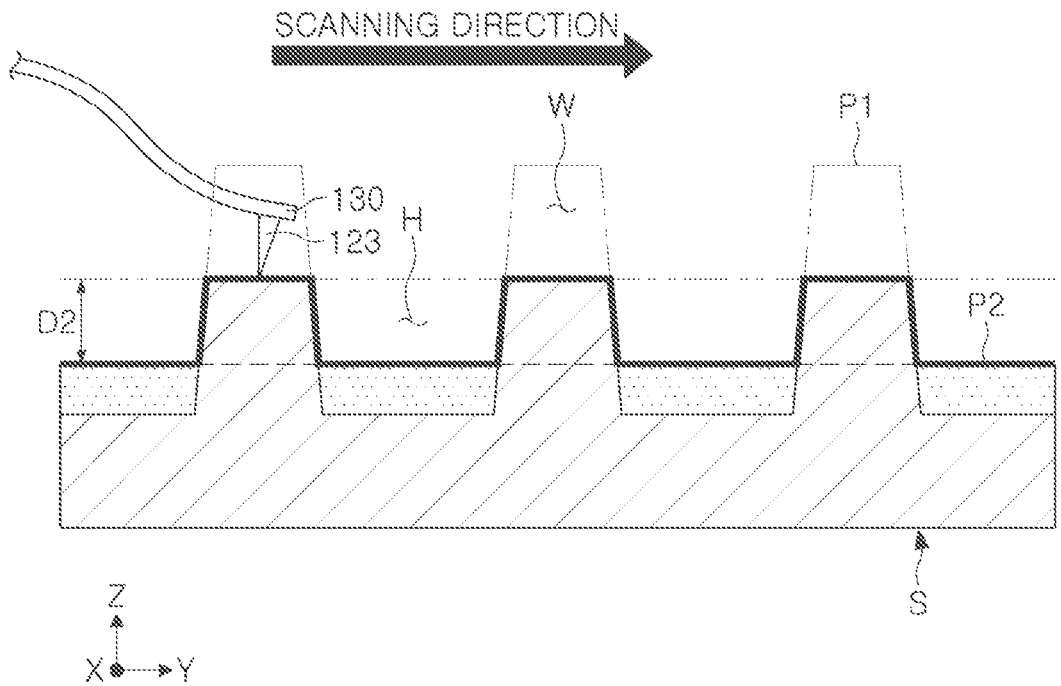

Referring to FIG. 8, the test apparatus 100 in an example embodiment may select the third tip 123 for performing profiling on the sample S after milling, and may couple the third tip 123 to the cantilever 130. For example, the third tip 123 may have a length greater than the second depth D2 at which profiling is to be performed in the first direction.

The test apparatus 100 may perform a second test to obtain structural information of the sample S from the first depth D1 to the second depth D2 using the third tip 123. For example, the test apparatus 100 may obtain the second test result by performing profiling. For example, the second test result may include a second profiling result corresponding to a structure of the sample S from the first depth D1 to the second depth D2.

Figure 9:
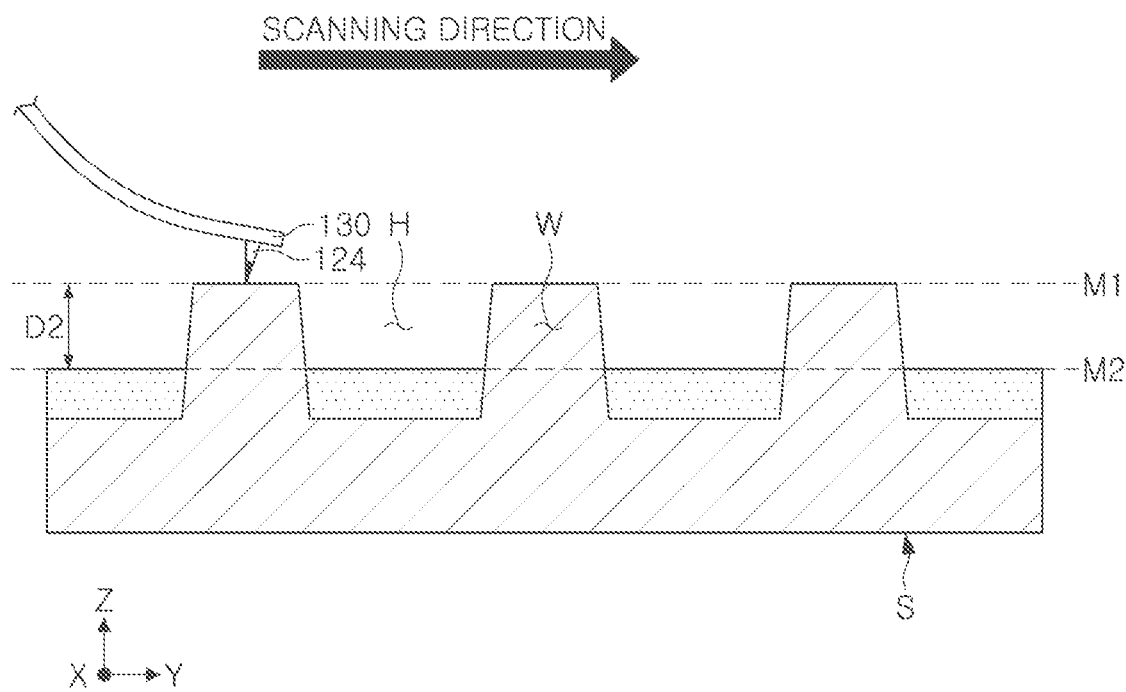

Referring to FIG. 9, the tip control unit 170 included in the test apparatus 100 may select a fourth tip 124 for performing milling on the sample S based on the second test result, and may determine conditions for milling. For example, the fourth tip 124 for performing milling after the second test may have a different structure from the second tip 122 for performing milling after the first test.

The test apparatus 100 may perform milling by the second depth D2 by adjusting the force between the fourth tip 124 and the sample S. The test apparatus 100 may remove the protrusion W formed at a position higher than the second milling position M2 by performing milling.

Figure 10:
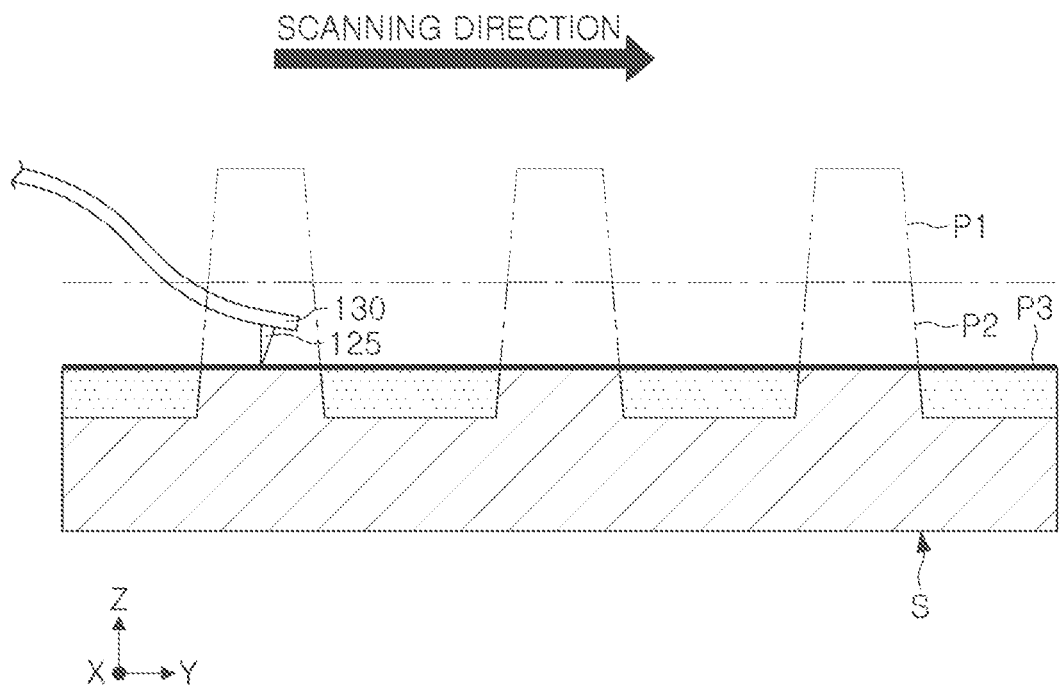

Referring to FIG. 10, the test apparatus 100 in an example embodiment may select a fifth tip 125 for performing profiling again on the sample S after milling, and may couple the fifth tip 125 to the cantilever 130. For example, the fifth tip 125 may have a structure different from that of the third tip 123 for performing profiling included in the second test.

The test apparatus 100 may perform a third test for obtaining structural information of the sample S at a predetermined depth using the fifth tip 125. For example, the test apparatus 100 may obtain a third test result by performing profiling. For example, the third test result may include a third profiling result P3 corresponding to a structure up to a predetermined depth corresponding to the target depth of the sample S.

Figure 11:
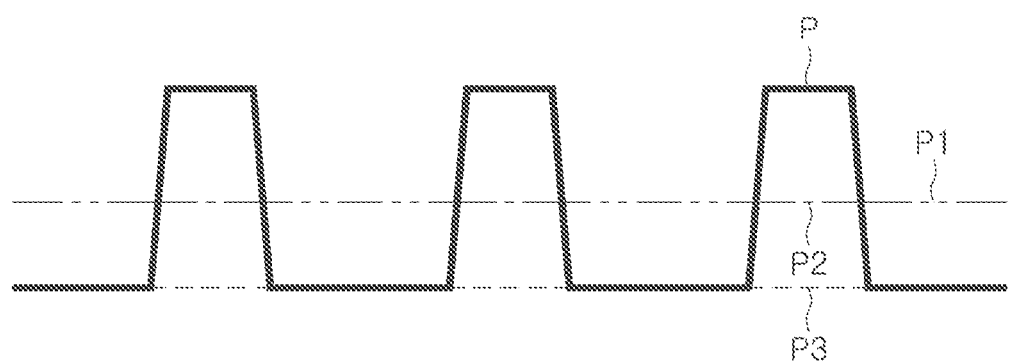

Referring to FIG. 11, the test apparatus 100 in an example embodiment may obtain the structure from the surface of the sample S to a predetermined depth by combining the first profiling result P1, the second profiling result P2, and the third profiling result P3. However, an example embodiment thereof is not limited thereto. For example, when the third profiling result P3 does not include information of the structure of the sample S at the target depth, the test apparatus 100 may further perform an additional test corresponding to the second test and the third test. Also, when combining the plurality of profiling results, correction may be accompanied to obtain a structural information more precisely.

The test apparatus 100 in an example embodiment may further include an additional tip, e.g., a sixth tip, for performing cleaning after milling in addition to the plurality of tips 121 through 125.

Although not illustrated in the test method illustrated in FIGS. 4 to 11, the test apparatus 100 may select the first tip 121 to obtain structural information and/or information of physical properties of the surface of the sample S, and may select the second through fifth tips 122 through 125 in order, e.g., sequentially, to be coupled to the cantilever 130, and may inspect the internal structure of the sample S.

Figure 12:
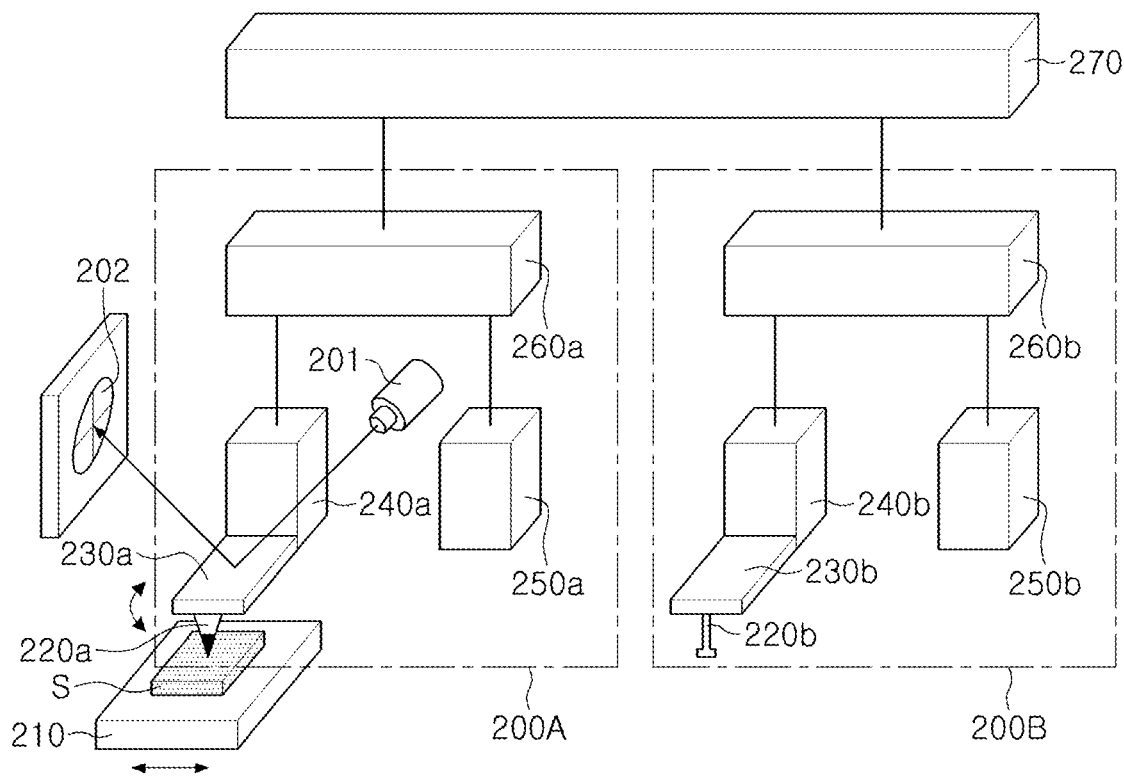
FIG. 12 is a diagram illustrating a test apparatus according to an example embodiment of the present disclosure.

FIG. 12 is a diagram illustrating a test apparatus according to an example embodiment.

Referring to FIG. 12, a test apparatus 200 in an example embodiment may include a sample stage 210, a tip control unit 270, and a plurality of test units 200A and 200B. Each of the plurality of test units 200A and 200B may include cantilevers 230a and 230b, tip stages 240a and 240b, position sensors 250a and 250b, stage control units 260a and 260b, and tips 220a and 220b coupled to the cantilevers 230a and 230b. However, an example embodiment thereof is not limited thereto, e.g., the stage control units 260a and 260b may be configured together with the tip control unit 270 as a control device. Also, the tip control unit 270 may also be included in each of the plurality of test units 200A and 200B.

The structure and operation of each of the components included in the test apparatus 200 may correspond to the components included in the test apparatus 100 illustrated in FIG. 1. However, since the test apparatus 200 in an example embodiment includes the plurality of test units 200A and 200B, the tips for performing different testing operations may be separately disposed, e.g., each of the tips for performing different testing operations may be disposed in a separate one of the plurality of test units 200A and 200B. For example, the first test unit 200A may include a tip 220a suitable for performing milling as a test unit for performing milling on the sample S, and the second test unit 200B may include a tip 220b suitable for performing profiling as a test unit for performing profiling on the sample S.

In the test apparatus 200 in an example embodiment, the tip control unit 270 may select a test unit for performing profiling or milling from among the plurality of test units 200A and 200B. For example, the tip control unit 270 may select the first test unit 200A to perform milling and may select the second test unit 200B to perform profiling. The test apparatus 200 may perform milling on the sample S in a desired position and may profile the structure of the sample S at a high speed, by repeatedly performing profiling and milling using the selected test unit.

Figure 13:
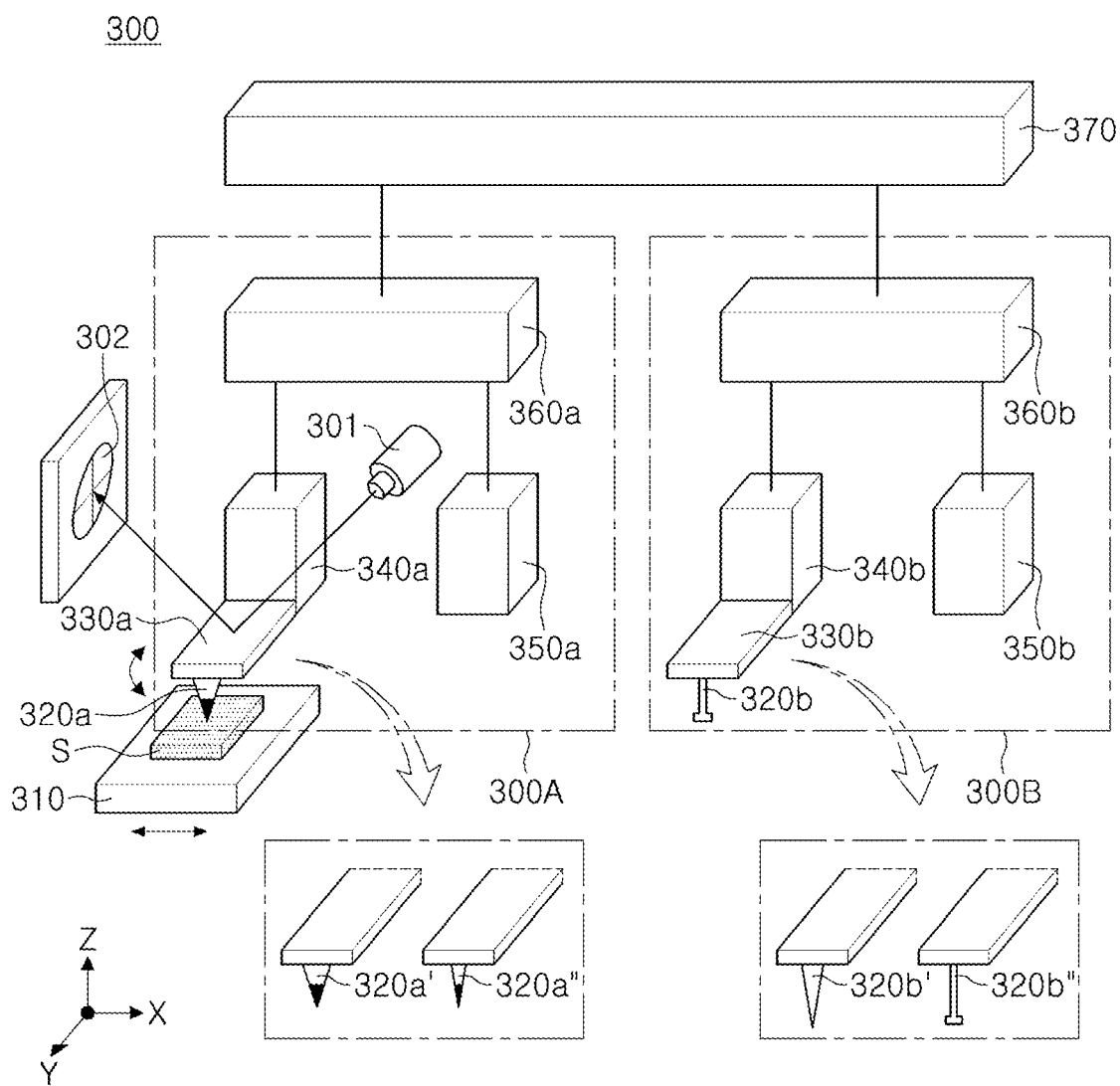
FIG. 13 is a diagram illustrating a test apparatus according to an example embodiment of the present disclosure.

FIG. 13 is a diagram illustrating a test apparatus according to an example embodiment.

Referring to FIG. 13, a test apparatus 300 in an example embodiment may have a configuration corresponding to the configuration of the test apparatus 200 illustrated in FIG. 12. For example, the test apparatus 300 may include a sample stage 310, a tip control unit 370, and a plurality of test units 300A and 300B. Each of the plurality of test units 300A and 300B may include cantilevers 330a and 330b, tip stages 340a and 340b, position sensors 350a and 350b, and stage control units 360a and 360b.

Each of the plurality of test units 300A and 300B included in the test apparatus 300 may include a plurality of tips 320a and 320b coupled to the cantilevers 330a and 330b. For example, the first test unit 300A for performing milling may include a plurality of milling tips 320a' and 320a" having different aspect ratios, and the second test unit 300B may include a plurality of profiling tips 320b' and 320b" having different shapes. When milling and profiling are performed multiple times, the plurality of tips 320a and 320b may be replaced and may be coupled to the cantilevers 330a and 330b, e.g., the plurality of tips 320a and 320b may be replaceable.

Similarly to the test apparatus 200 illustrated in FIG. 12, the tip control unit 370 included in the test apparatus 300 may include a test unit for performing profiling or milling among the plurality of test units 300A and 300B. The tip control unit 370 may select a tip for performing profiling or milling from each of the plurality of test units 300A and 300B. The test apparatus 300 may perform milling on the sample S in a desired position and may profile the structure of the sample S at high speed, by repeatedly performing profiling and milling using the selected test unit and the selected tip.

Figure 14:
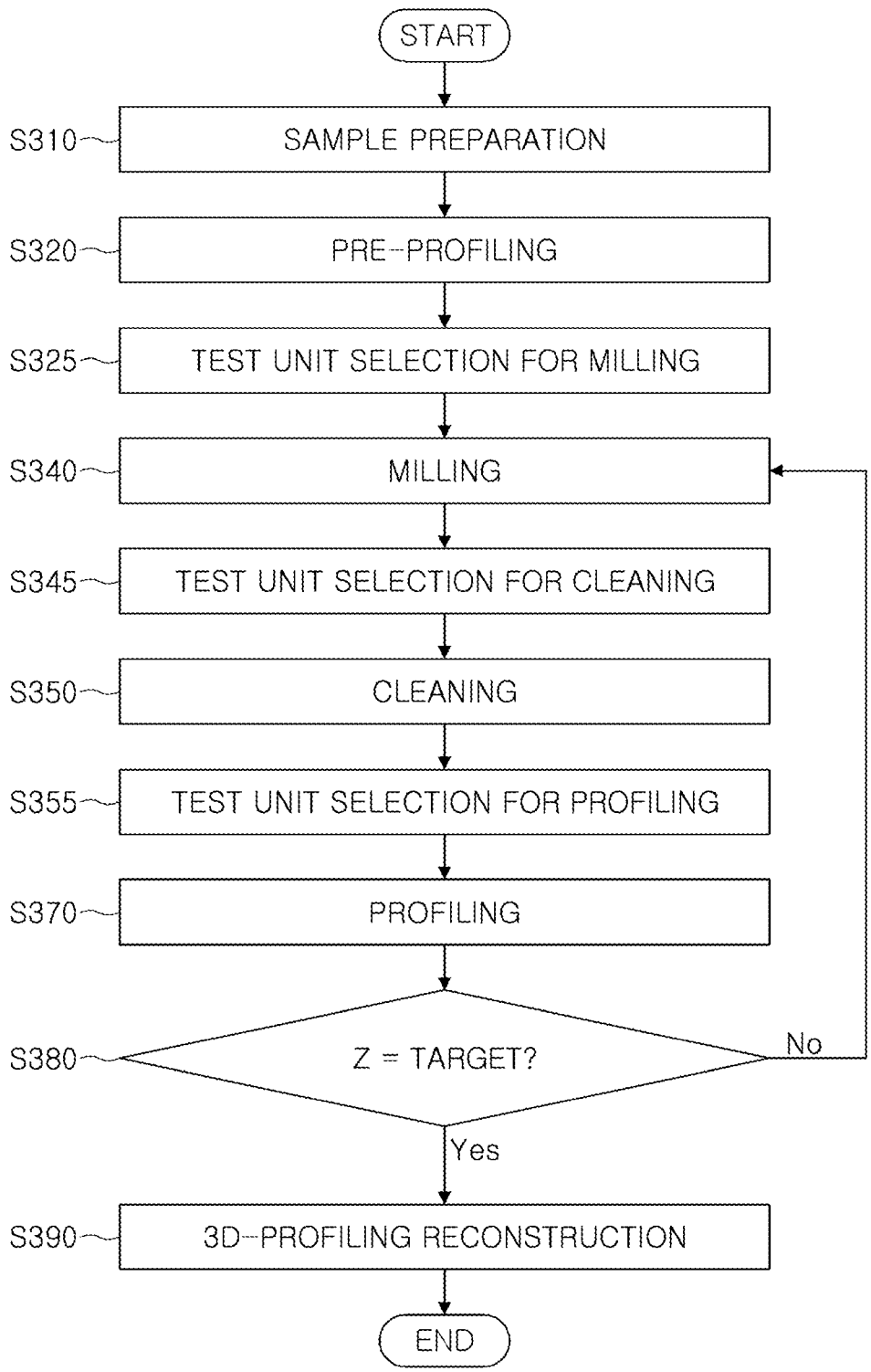
FIG. 14 is a flowchart illustrating a test method by a test apparatus according to an example embodiment of the present disclosure.

FIG. 14 is a flowchart illustrating a test method by the test apparatuses 200 and 300 according to an example embodiment of the present disclosure.

Referring to FIG. 14, the test method by the test apparatuses 200 and 300 in example embodiments may include operations corresponding to operations S110 to S190 illustrated in FIG. 2. As an example, the test apparatuses 200 and 300 may start the testing operation by disposing the sample S on the upper surfaces of the sample stages 210 and 310 (S310), and may perform pre-profiling on the surface of the sample S using the first tip before a structural test (S320). As an example, the first tip may be optimized for obtaining structural information and information of physical properties of the surface of the sample S from pre-profiling.

The test apparatuses 200 and 300 in an example embodiment may include a plurality of test units 200A, 200B, 300A, and 300B. Each of the plurality of test units 200A, 200B, 300A, and 300B may perform different testing operations. For example, the first test units 200A and 300A may be configured to perform profiling, and the second test units 200B and 300B may be configured to perform milling. However, an example embodiment thereof is not limited thereto. For example, the test apparatuses 200 and 300 may further include a test unit for performing additional testing operations such as pre-profiling and cleaning.

After completing the pre-profiling, the test apparatuses 200 and 300 may select a test unit for performing milling (S325), and the selected test unit may perform milling (S340). For example, when each of the plurality of test units 300A and 300B includes a plurality of tips 320a and 320b similarly to the test apparatus 300 illustrated in FIG. 13, the tip control unit 370 may select the test unit, may select the second tip optimized for performing milling before performing milling, and may determine conditions for performing milling based on a result of pre-profiling. The test apparatus 300 may perform milling on the sample S under the determined conditions for performing milling using the selected second tip.

After the milling is completed, the tip control units 260 and 370 of the test apparatuses 200 and 300 in an example embodiment may select a test unit for performing cleaning (S345), and the selected test unit may perform cleaning (S350). Although not illustrated in FIG. 14, when each of the plurality of test units 300A and 300B includes a plurality of tips 320a and 320b, the tip control unit 370 of the test apparatus 300 may select the test unit, may select the additional tip optimized for performing cleaning before performing cleaning, and may replace the tip. The test apparatus 300 may perform cleaning using the selected additional tip.

After completing cleaning using the additional tip, the tip control units 260 and 370 of the test apparatuses 200 and 300 in an example embodiment may select a test unit for performing profiling (S355), and the selected test unit may perform profiling (S370). Although not illustrated in FIG. 14, when each of the plurality of test units 300A and 300B includes a plurality of tips 320a and 320b, the tip control unit 370 of the test apparatus 300 may select the test unit, may select a tip optimized for performing profiling before performing profiling, and may replace the tip. The test apparatus 300 may perform profiling using the selected third tip.

After completing profiling using the tip, the test apparatuses 200 and 300 may determine whether the structural information at the target depth has been obtained, similarly to the test method illustrated in FIG. 5 (S380). When the test apparatuses 200 and 300 fail to obtain structural information at the target depth, the test apparatuses 200 and 300 may repeatedly perform operations S330 to S380 until the test apparatuses 200 and 300 obtain the structural information at the target depth. When the test apparatuses 200 and 300 obtain the structural information at the target depth, the test apparatuses 200 and 300 may reconstruct the structural information obtained in the previous operations, and may obtain structural information from the surface of the sample S to the target depth (S390).

Figure 15:
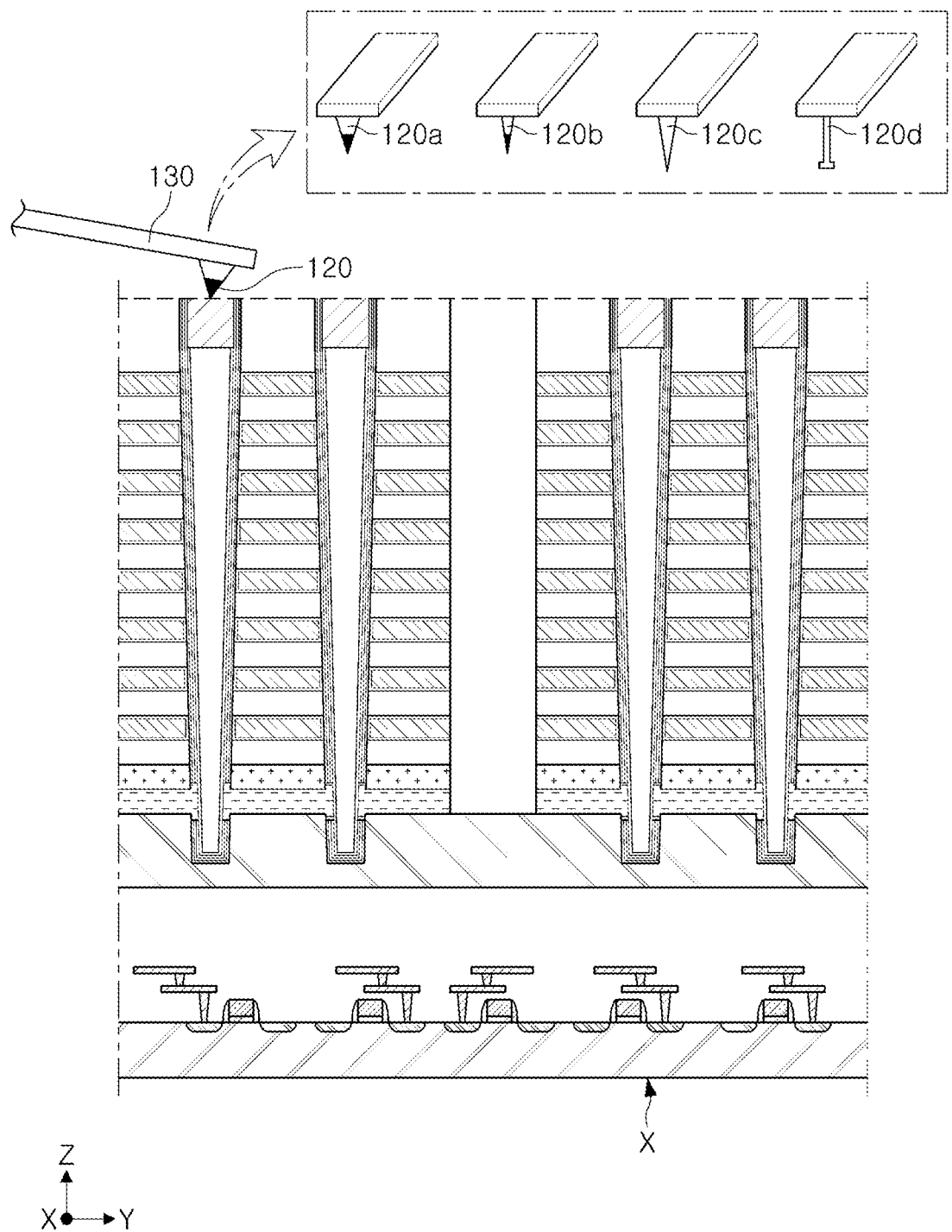
FIG. 15 is a diagram illustrating a structure inspection by a test apparatus according to an example embodiment of the present disclosure.

FIG. 15 is a diagram illustrating a structure inspection by the test apparatus 100 according to an example embodiment.

Referring to FIG. 15, the test apparatus 100 in an example embodiment may swiftly and precisely inspect a structure and test physical properties of a microstructure X having a size of a micro-unit or a nano-unit. The test apparatus 100 may measure the structure at a predetermined depth of the microstructure X by alternately performing profiling and milling as described above. The test apparatus 100 may additionally perform an operation such as cleaning in addition to profiling and milling, if desired.

The test apparatus 100 in an example embodiment may select an optimal tip and may perform a testing operation if desired. For example, the test apparatus 100 may include a plurality of tips 120 coupled to the cantilever 130, and may selectively couple an optimal tip to the cantilever 130 to perform the test.

For example, to perform a milling operation, one of the tips 120a and 120b including a material having high rigidity may be selected and coupled to the cantilever 130. Also, to perform a profiling operation, one of the tips 120c and 120d having different shapes may be selected and coupled to the cantilever 130 depending on the profiled target. However, the plurality of tips 120 illustrated in FIG. 15 are merely an example and an example embodiment thereof is not limited thereto. The test apparatus 100 may determine optimal conditions for performing a milling operation, and may effectively inspect a structure and test physical properties of the microstructure X.

By way of summation and review, when a structure of a device is measured using a general method, there may be a limitation in securing the device structure in a desired location, and it may be difficult to secure the structural information about a large area in a large amount. In contrast, an example embodiment of the present disclosure provides a test apparatus which may selectively perform milling on a sample in a desired location using a plurality of tips, e.g., a plurality of replaceable AFM probe tips having different shapes and rigidity levels, and profiling a three-dimensional structure of the sample at a high speed, and a test method thereof.

According to the aforementioned example embodiments, by performing milling and profiling using a plurality of differently shaped tips (e.g., rather than a single tip), the structure of a sample may be measured at a high speed. The test apparatus in an example embodiment may, by selecting an optimal tip during milling and profiling and determining optimal conditions for performing milling, effectively perform structural inspection. That is, it may be possible to simultaneously measure the vertical structure change and the underlying 2D structure, and only the desired pattern can be selectively removed. Further, through pre-scanning, the shape of the pre-created pattern is checked preemptively and the pattern at the desired location is effectively removed using the optimal tip, e.g., it may be possible to secure an additional three-dimensional structure for the lower structure that cannot be accessed with a general Lip.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A test apparatus, comprising:
   a sample stage to support a sample, the sample stage being movable to adjust a position of the sample in a direction parallel to an upper surface of the sample stage;
   a plurality of tips above the sample stage, the plurality of tips having different shapes, and the plurality of tips being configured to alternately perform profiling and milling on the sample supported on the sample stage;
   a tip stage connected to a cantilever, the cantilever being coupled to at least one of the plurality of tips, and the tip stage being configured to adjust a position of the cantilever in a first direction perpendicular to the upper surface of the sample stage to alternately perform profiling and milling on the sample supported on the sample stage;
   a position sensor configured to obtain information about a positional relationship between the at least one of the plurality of tips and the sample;
   a stage controller configured to control movements of the sample stage and the tip stage, based on the information about the positional relationship; and
   a tip controller configured to select the at least one of the plurality of tips for alternately performing the profiling and the milling on the sample supported on the sample stage and to determine conditions for performing the milling on the sample supported on the sample stage,
   wherein a depth of the sample being processed by the milling in the first direction is controlled based on a relationship between a distance between the at least one of the plurality of tips and the sample and a force between the at least one of the plurality of tips and the sample.

2. The test apparatus as claimed in claim 1, wherein the test apparatus is configured to inspect a structure of the sample in the first direction and the structure of the sample in a direction perpendicular to the first direction by the profiling.

3. The test apparatus as claimed in claim 1, wherein the test apparatus is configured to obtain structural information and information of physical properties of a surface of the sample by the profiling.

4. The test apparatus as claimed in claim 1, wherein the test apparatus is configured to perform the milling in a predetermined position of the sample by controlling the movements of the sample stage and the tip stage based on a result of the profiling.

5. The test apparatus as claimed in claim 1, wherein the tip controller is configured to select the at least one of the plurality of tips based on at least one of a shape of the tip, rigidity of the tip, structural information of a surface of the sample, and information of physical properties of a surface of the sample.

6. The test apparatus as claimed in claim 1, wherein the conditions for performing the milling include at least one of a milling direction, a milling area, and a milling depth.

7. The test apparatus as claimed in claim 1, wherein the plurality of tips include cone-shaped tips having different aspect ratios, and a tip including a hammer-shaped head.

8. The test apparatus as claimed in claim 1, wherein the milling is performed using the at least one of the plurality of tips, and the profiling is performed using another one of the plurality of tips before and after the milling.

9. The test apparatus as claimed in claim 1, wherein the profiling and the milling are repeatedly performed until structural information of the sample is obtained at a predetermined depth.

10. The test apparatus as claimed in claim 1, further comprising a vibration isolation table below the sample stage.

11. A test apparatus, comprising:
    a sample stage to support a sample, the sample stage being movable to adjust a position of the sample in a direction parallel to an upper surface of the sample stage;
    a plurality of tips including a first tip, at least one second tip, and at least one third tip that have different shapes from each other, the first tip being configured to perform pre-profiling to obtain surface information of the sample, the at least one second tip being configured to perform milling on the sample supported on the sample stage, and the at least one third tip being configured to perform profiling on the sample supported on the sample stage;
    a tip stage connected to a cantilever, the cantilever being coupled to one of the plurality of tips, and the tip stage being configured to adjust a position of the cantilever in a first direction perpendicular to the upper surface of the sample stage to alternately perform profiling and milling on the sample supported on the sample stage;
    a position sensor configured to obtain information about a positional relationship between a selected tip for alternately performing the profiling or and the milling among the plurality of tips and the sample supported on the sample stage;
    a stage controller configured to control movements of the sample stage and the tip stage based on the information about the positional relationship; and
    a tip controller configured to select the selected tip for performing the profiling or the milling on the sample supported on the sample stage and to determine conditions for performing the milling on the sample supported on the sample stage.

12. The test apparatus as claimed in claim 11, wherein each of the at least one second tip and the at least one third tip includes multiple tips having different shapes and different levels of rigidity from each other.

13. The test apparatus as claimed in claim 11, wherein the tip controller is configured to select the first tip to perform a first test to inspect a structure from a surface of the sample to a first depth.

14. The test apparatus as claimed in claim 13, wherein the tip controller is configured to select the at least one second tip and the at least one third tip in sequence to perform a second test to inspect a resultant structure from the first depth to a second depth of the sample, after the first test.

15. The test apparatus as claimed in claim 14, wherein the at least one second tip and the at least one third tip are configured to repeatedly perform the second test and to inspect a resultant structure from the surface of the sample to a predetermined depth based on results of the first test and a previous second test.

16. The test apparatus as claimed in claim 11, wherein the plurality of tips further include a fourth tip configured to perform cleaning after the milling.

17. The test apparatus as claimed in claim 16, wherein the tip controller is configured to select the first tip to obtain information about an upper surface of the sample, and to select the at least one second tip, the fourth tip, and the at least one third tip in sequence to inspect an internal structure of the sample.

18. A test apparatus, comprising:
    a sample stage to support a sample, the sample stage being movable to adjust a position of the sample in a direction parallel to an upper surface of the sample stage;

a plurality of test units above the sample stage, each of the plurality of test units including:

a tip configured to perform profiling or milling on the sample supported on the sample stage until reaching a predetermined depth, a tip stage connected to a cantilever, the cantilever being coupled to the tip, and the tip stage being configured to adjust a position of the cantilever in a first direction perpendicular to the upper surface of the sample stage to alternately perform profiling and milling on the sample supported on the sample stage, a position sensor configured to obtain information about a positional relationship between the tip and the sample, and a stage controller configured to control a movement of the tip stage based on the information about the positional relationship; and a tip controller configured to select a test unit to alternately perform the profiling or and the milling on the sample supported on the sample stage from among the plurality of test units, and to determine conditions for the milling on the sample supported on the sample stage based on a relationship between a distance between the tip and the sample and a force between the tip and the sample, wherein the tips in the plurality of test units have different shapes from each other.

19. The test apparatus as claimed in claim 18, wherein the plurality of test units include a first test unit with a first tip for performing the milling, and a second test unit with a second tip for performing the profiling.

20. The test apparatus as claimed in claim 18, wherein:

each of the plurality of test units includes a plurality of replaceable tips, and the tip controller is configured to select a tip for performing the profiling or the milling from among the plurality of replaceable tips.

* * * * *